United States Patent [19]

Katsura et al.

[11] Patent Number: 4,933,063
[45] Date of Patent: Jun. 12, 1990

[54] SPUTTERING DEVICE

[75] Inventors: Toshihiko Katsura; Masahiro Abe, both of Yokohama, Japan

[73] Assignee: Kabushiki Kaisha Toshiba, Kawasaki, Japan

[21] Appl. No.: 281,366

[22] Filed: Dec. 8, 1988

[30] Foreign Application Priority Data

Dec. 9, 1987 [JP] Japan .................. 62-311277

[51] Int. Cl.⁵ ............. C23C 14/34; C23C 14/50
[52] U.S. Cl. ............... 204/298.03; 204/298.09; 204/298.12
[58] Field of Search ............ 204/298 CS, 298 TS, 204/298 WH

[56] References Cited

U.S. PATENT DOCUMENTS 4,610,775  9/1986  Phifer ............................. 204/298

FOREIGN PATENT DOCUMENTS 0265320  4/1988  France ............................ 204/298
56-21836  5/1981  Japan ............................. 204/298
58-164228  9/1983  Japan ............................. 204/298
63-121659  5/1988  Japan ......................... 204/298 CS

OTHER PUBLICATIONS

Patent Abstracts of Japan, vol. 10, No. 168 (E-411) {2224}, 14th Jun. 1986 and JP-A-61 20 317 (Nippon Denki K. K.), Jan. 29, 1986.

Primary Examiner—Aaron Weisstuch
Attorney, Agent, or Firm—Finnegan, Henderson, Farabow, Garrett and Dunner

[57] ABSTRACT

A sputtering device includes a vacuum chamber, a target disposed in the vacuum chamber, a protection plate formed to surround the target with a space therebetween, and having an opening formed in front of the target, a substrate holder for holding a semiconductor wafer substrate and substantially closing the opening in front of the target in cooperation with the semiconductor wafer substrate, and an A.C. power source for striking the target with charged particles to emit target material when the semiconductor wafer substrate is set in front of the target, whereby depositing target material thereon as a sputtered film. The sputtering device further includes a temperature sensor, a heater unit and heater controller to heat at least the protection plate to a specified temperature and to maintain the specified temperature after sputtering is complete.

9 Claims, 4 Drawing Sheets

SPUTTERING DEVICE

BACKGROUND OF THE INVENTION

1. Field of the Invention

This invention relates to a device for manufacturing semiconductor devices, and more particularly to a sputtering device for depositing insulation or metal material on a semiconductor wafer substrate.

2. Description of the Related Art

High speed sputtering devices for sputtering processes for use with semiconductor wafer substrates are known. FIG. 1 shows the internal structure of this type of high speed sputtering device. In such a high speed sputtering device, the sputtering process is repeatedly effected in a vacuum chamber VC which is kept in a low pressure condition. The pressure in vacuum chamber VC is reduced with cathode mounting CS inserted in cathode flange 11 and cathode flange 11 placed in contact with chamber wall 13 via O-ring 12. Target 16 is previously mounted on backing plate 17 in vacuum chamber VC at an angle of approximately 85° which is close to a right angle with respect to the horizontal plane. Further, semiconductor wafer substrate 19 is horizontally carried into pressure-reduced vacuum chamber VC, and is transferred onto substrate holder 18 disposed in a horizontal position near target 16. Substrate holder 18 is raised, i.e., rotated upward, as shown by the arrow in FIG. 1 so as to orient the semiconductor wafer substrate 19 parallel to target 16. The sputtering process is effected after semiconductor wafer substrate 19 is disposed in the above-described preset sputtering position. In the sputtering process, a sputtered film is formed as a result of Ar+ ions striking target 16 in a magnetron-type discharging atmosphere and depositing sputtered particles emitted from target 16 on the semiconductor wafer substrate 19. In the case where a sputtered film of $SiO_2$ is formed, for example, the sputtered film normally grows at a rate of 150 nm/min.

The sputtered particles are emitted from target 16 in various directions besides those towards wafer substrate 19 during the sputtering process. Assume that sputtered particles are deposited on chamber wall 13, for example, to form a sputtered film thereon. Then, part of the sputtered film may be peeled off from chamber wall and will drop as dust particles onto a next wafer substrate 19 which is carried in for the succeeding sputtering process, thus contaminating the surface of that next wafer substrate 19. For this reason, dome-shaped protection member or plate 15 is disposed to surround the peripheral region of target 16 in vacuum chamber VC. Protection plate 15 has opening 15A formed at the center thereof, and opening 15A is substantially closed by wafer substrate 19 and the periphery of substrate holder 18 when wafer substrate 19 is disposed in the preset sputtering position. In this case, sputtered particles emitted in directions different from those towards wafer substrate 19 will form sputtered films on protection plate 15 and the outer periphery of substrate holder 18.

When part of the sputtered film is deposited as dust particles on the next wafer substrate 19 in the sputtering process, the properties of the sputtered film formed on that wafer substrate 19 will be changed. For example, when the sputtered film is an insulating film, current leakage, reduction in the break-down voltage and the like may occur in the manufactured semiconductor device. In this case, in order to prevent part of the sputtered film from peeling off from protection plate 15 and substrate holder 18 and then dropping directly onto the next wafer substrate 19, wafer substrate 19 is disposed at an angle close to a right angle with respect to the horizontal plane.

However, in this type of sputtering device, part of the sputtered film is peeled off from protection plate 15 and substrate holder 18 and then deposited on the bottom of protection member 15. It is impossible to sufficiently prevent the deposited sputtered particles from being whirled up and attached as dust particles to wafer substrate 19 during the succeeding sputtering process. Further, since the sputtered film grows at high speed on protection plate 15 and substrate holder 18 as well as on wafer substrate 19, it becomes necessary to frequently replace or remove protection plate 15 and substrate holder 18 for cleaning. As a result, the availability or operating through-put of the sputtered device will be lowered.

SUMMARY OF THE INVENTION

An object of this invention is to provide a sputtering device which can reduce the amount of dust particles deposited on the semiconductor wafer substrate during a repeated sputtering process.

The object can be attained by a sputtering device comprising a vacuum chamber, a target disposed in the vacuum chamber, a protection member formed to surround the target with a space therebetween and having an opening formed in front of the target, a substrate holder for holding a semiconductor wafer substrate and substantially closing the opening of the protection member in cooperation with the semiconductor wafer substrate, a discharging circuit for causing target material to be emitted from the target when the semiconductor wafer substrate is disposed in front of the target, thereby depositing the target material on the semiconductor wafer substrate as a sputtered film, and a heating means for heating at least the protection member to a specified temperature and maintaining the specified temperature after completion of sputtering.

In the above sputtering device, even when the target material is deposited on the protection member and substrate holder to form sputtered films thereon, the sputtered films will partly be peeled off as dust particles. In general, the temperature of the protection member will start to rise when operation of the discharging circuit is started and fall at the end of the operation. For example, when the temperature of the protection member is changed in response to the operating condition of the discharging circuit, the sputtered film formed on the protection member may tend to be peeled off by the stress due to the difference between the thermal expansion coefficients of the target material and the material constituting the protection member. Nevertheless, according to the invention, in the above sputtering device, the temperature of the protection member is prevented from falling lower than the specified temperature. Thus, the range of temperature variation becomes small and peel-off of the sputtered film will be prevented or resisted. If the specified temperature is set to be higher than the maximum temperature attained by the operation of the discharging circuit unit, the sputtered film will hardly be peeled off at all, even when it continuously grows on the protection member.

DETAILED DESCRIPTION OF THE PREFERRED EMBODIMENTS

Figure 1:
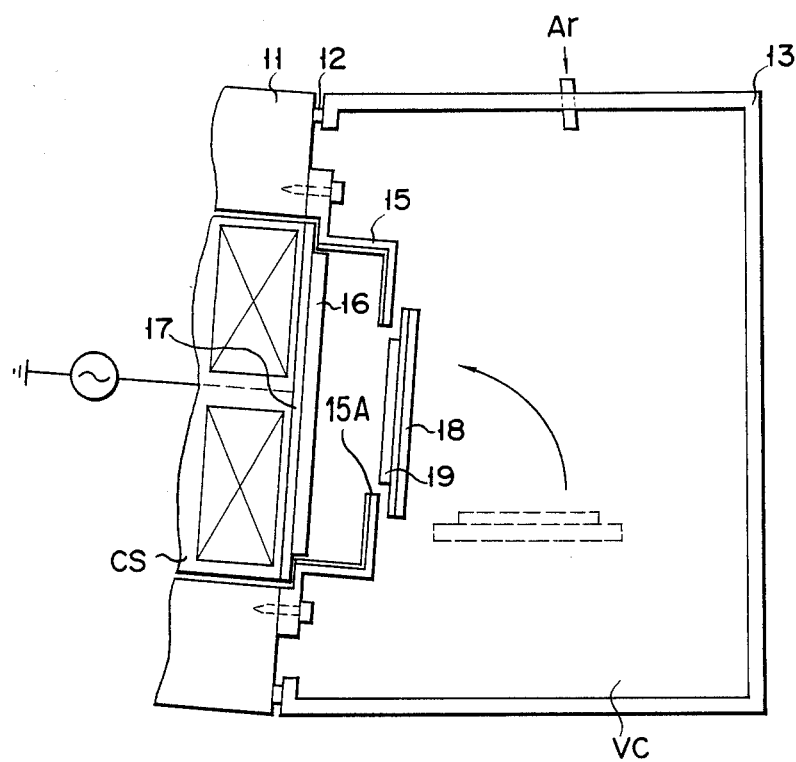
FIG. 1 is a cross-sectional view showing the internal structure of a conventional high speed sputtering device.
Figure 2:
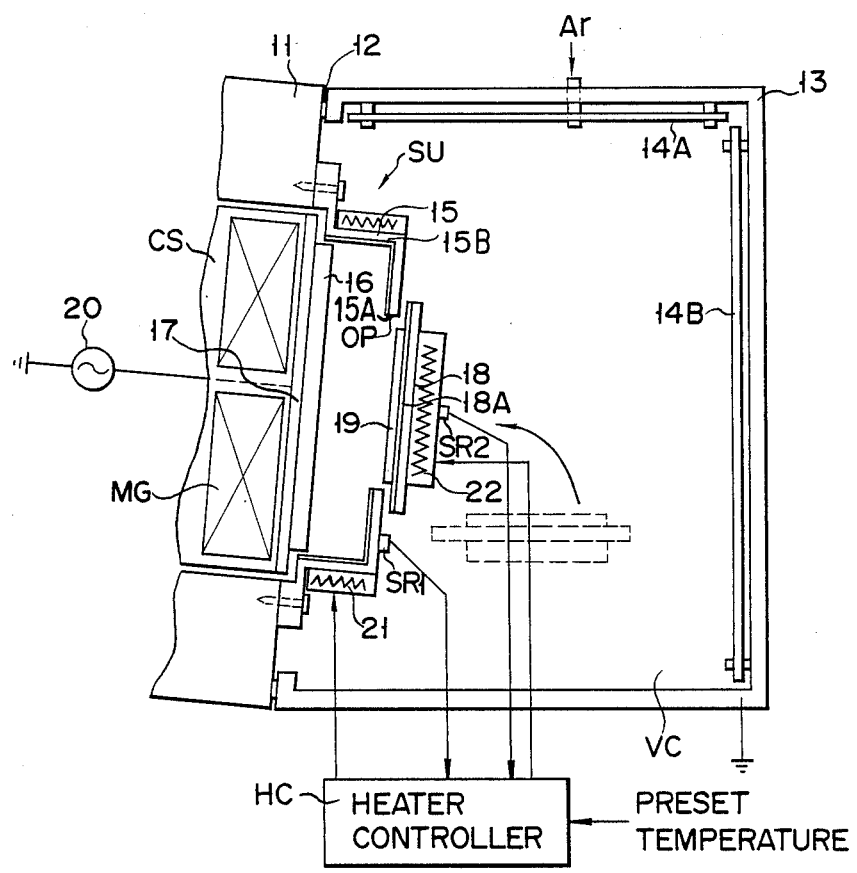
FIG. 2 is a cross-sectional view showing the internal structure of a high speed sputtering device according to a first embodiment of this invention.

There will now be described a high-speed sputtering device for formation of an insulation film according to a first embodiment of this invention will reference to FIGS. 2 to 4. FIG. 2 is a diagram showing the cross-sectional structure of the sputtering device. Portions corresponding to those in the prior art device shown in FIG. 1 are denoted by the same reference numerals. The sputtering device includes cathode flange 11, O-ring 12, chamber wall 13, chamber side protection plates 14A and 14B, cathode mounting CS, backing plate 17 for target 16, substrate holder 18, A.C. power source 20 and heater controller HC. Cathode flange 11, O-ring 12, chamber wall 13 and backing plate 17 are combined to constitute vacuum chamber VC in the same manner as in the conventional apparatus. Chamber side protection plates 14A and 14B are added elements respectively arranged on the upper and side portions of chamber wall 13. The sputtering device further includes three sputtering units each including target side protection plate 15, target 16, first and second heater units 21 and 22, and temperature sensors SR1 and SR2. In FIG. 2, only first sputtering unit SU, which is one of the three sputtering units, is shown; and the other two sputtering units are not shown. Target 16 is formed of high purity quartz and is mounted on backing plate 17 functioning as a target electrode. Backing plate 17 is mounted on cathode mounting CS. Permanent magnet MG is embedded in cathode mounting CS. The pressure within vacuum chamber VC is reduced after cathode mounting CS is disposed in the slot of cathode flange 11 and cathode flange 11 is disposed in contact with chamber wall 13 via O-ring 12. At this time, target 16 is held at an angle of 85° with respect to the horizontal plane of vacuum chamber VC. Protection plate 15 is formed in a dome shape, and mounted on cathode flange 11 to surround target 16 and the peripheral portion thereof. Protection plate 15 has an opening 15A which is slightly larger than the diameter (e.g., 5 inches) of semiconductor wafer substrate 19. Opening 15A is disposed to face target 16. Protection plate 15 and substrate holder 18 are formed of stainless steel, and side surfaces of protection plate 15 and substrate holder 18 near target 16 are entirely coated with quartz films 15B and 18A having substantially the same thermal expansion coefficient as the target material. Heater units 21 and 22 are fixed on chamber wall side surfaces, which are surfaces of protection plate 15 and substrate holder 18. Temperature sensors SR1 and SR2 are used to measure the temperature of protection plate 15 and substrate holder 18 and generate output signals, respectively. Heater controller HC controls heater units 21 and 22 so as to heat protection plate 15 and substrate holder 18 to a preset temperature which is supplied from the outside and maintain the preset temperature based on the output signals from sensors SR1 and SR2. A.C. power source 20 is used to supply power to target 16 for each sputtering process to form a sputtered film on semiconductor wafer substrate 19.

Semiconductor wafer substrate 19 is supplied in a 24-sheets wafer carrier (not shown) and moved into pressure-reduced vacuum chamber VC. Then, semiconductor wafer substrate 19 is taken out of the wafer carrier, horizontally transferred onto substrate holder 18 disposed in front of target 16, and held by substrate holder 18. Substrate holder 18 is raised, i.e., rotated upward, as shown by the arrow in FIG. 2 to orient semiconductor wafer substrate 19 at a specified position in which it is parallel with target 16. The sputtering process is started after semiconductor wafer substrate 19 is in the specified position. In the sputtering process, Ar gas is supplied into pressure-reduced vacuum chamber VC, and A.C. power is applied to target 16 via backing plate 17 functioning as the target electrode. At this time, $Ar^+$ ions are created and strike target 16 because of the magnetron-type discharge, thereby causing target material to be emitted from target 16 as sputtered particles. The sputtered particles are attached to semiconductor wafer substrate 19 to form a sputtered film. At the same time, sputtered films are also formed on protection plate 15 and substrate holder 18. In the sputtering process, the temperature of protection plate 15 and substrate holder 18 is raised to 200° C. at maximum.

When the sputtering discharging operation or sputtering process is occurring, heaters 21 and 22 are in the OFF state; but the temperature of protection plate 15 and substrate holder 18 rises to 200° C. by heat generated in the sputtering process. After the end of the sputtering process, heaters 21 and 22 are placed into the ON state to keep the temperature of projection plate 15 and substrate holder 18 at 200° C. Since, in this case, protection plate 15 and substrate holder 18 are kept at a constant temperature, any increase in the number of particles due to peel-off of the sputtered film can be significantly suppressed even if the material of protection plate 15 and substrate holder 18 has a thermal expansion coefficient different from that of the material of the sputtered film deposited thereon.

Figure 3:
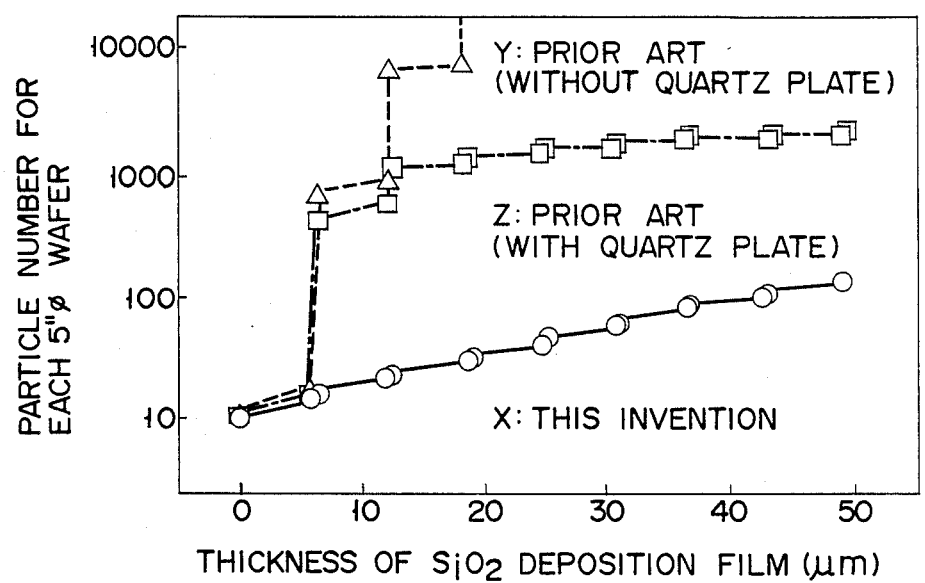
FIG. 3 is a graph showing the relation between the thickness of an $SiO_2$ film and the number of dust particles to illustrate the effect of the high speed sputtering device shown in FIG. 2.

FIG. 3 shows the dependency of the number of particles of more than 0.3 μm attached to a wafer substrate of 5 inch diameter on the thickness of the sputtered film (the total thickness of the sputtered films deposited on the wafer substrates using a clean protection plate 15 and clean substrate holder 18). In each sputtering process, one lot of 24 sheets of bare silicon wafers were subjected to the sputtered film formation process; $SiO_2$ films were formed on 8 sheets of wafers in each sputtering unit so as to have a thickness of 1000 Å on the first and eighth ones of the wafers and a thickness of 10000 Å on the second to seventh ones of the wafers, and the first and eighth ones of the wafers were subjected to measurement. In this case, the numbers of particles measured in the three sputtering units were averaged to provide the measurement. The measurement was effected under the condition that the ultimate degree of vacuum was $1.5 \times 10^{-7}$ Torr, the partial pressure of Ar in the sputtering process was $3.0 \times 10^{-3}$ Torr, flow rate of Ar was 30 SCCM, and the sputtered film formation speed was 1500 Å/min.

In the above embodiment, the preset temperature was set at 200° C. However, the ultimate or maximum attainable temperature of the protection plate will vary depending on the distance between target 16 and wafer substrate 19, the shape of chamber VC, target power and the like, For this reason, the optimum preset temperature of the protection plate may be different for each sputtering device. Therefore, the preset temperature may be determined depending on the stable temperature of protection plate 15 attained during the sputtering process of each sputtering device. Further, it is preferable that the preset temperature is not more than 20° C. below the maximum temperature of protection plate 15 attained during the sputtering process.

Figure 4:
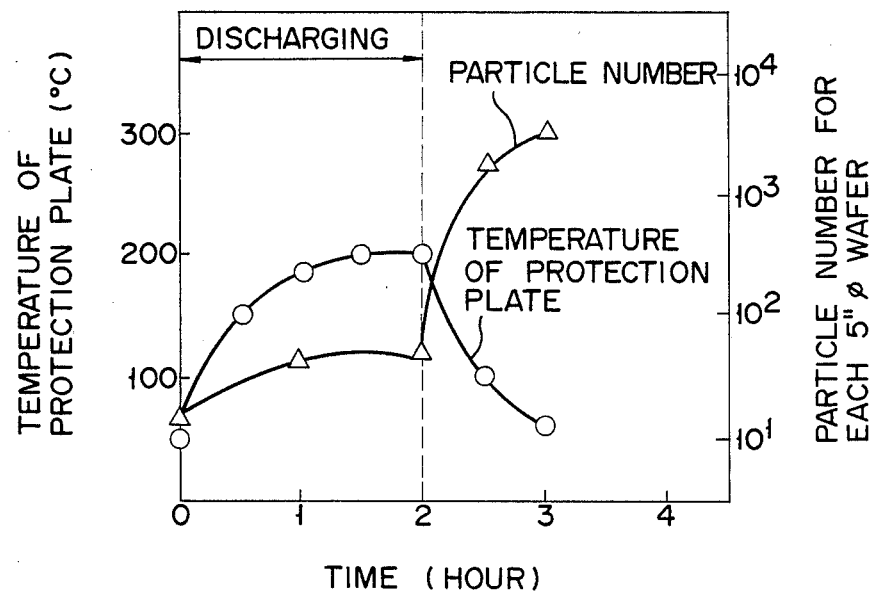
FIG. 4 is graph showing variation in temperature and in the number of dust particles before and after the sputtering process to illustrate the effect of the high speed sputtering device shown in FIG. 2.

In the above embodiment, the preset temperature is determined as shown in FIG. 4. FIG. 4 shows the relation between the variation in the number of particles and variation in the temperature of protection plate 15 during sputtered film formation (discharging operation) and after the end of the film formation. As is clearly seen from FIG. 4, the number of particles rapidly increases as the temperature of the protection plate decreases after the discharging operation.

Further, in an illustrative test of this embodiment, the temperature of the sputtered film formation portion (protection plate 15 and substrate holder 18) was kept at 200° C.; and a running test for formation of the SiO$_2$ sputtered film was effected. The dependency of the number of particles on the thickness of the sputtering film was attained as the result of the test. In FIG. 3, the dependency of the particle number on the film thickness is shown by solid lines X, and the dependency of the particle number on the film thickness attained as the result of the conventional running test effected without maintaining the preset temperature is shown by broken lines Y and dot-dash lines Z.

The specified value of the number of particles of more than 0.3 μm size is normally set less than 100. In the conventional method, the specified value will be exceeded when a film of 7 μm is formed. In contrast, according to this invention, the specified value will not be exceeded even when a film of approximately 40 μm is formed. Assume that one lot of 24 wafers is simultaneously processed in a sputtering device with the three targets and films are formed on 8 sheets of wafers by each target. In this instance, if a film of 1 μm thickness is formed on each wafer, a film of 8 μm thickness will have been deposited on the respective protection member 15 and exposed portions of substrate holder 18 for each target. Therefore, each time films are formed for one lot of wafers according to the conventional method, it is necessary to clean those chamber portions on which the sputtered film is deposited. However, in this invention, the cleaning operation is required only once each time five lots are processed. When the protection plate is consequently replaced, it is necessary to set the pressure of the vacuum chamber to the atmospheric pressure and it takes a long time to reduce the pressure of the vacuum chamber after the replacement. Generally, it takes a total of 5 hours at a minimum to set a ready condition again after such replacement. In this invention, the overall lost time is significantly reduced, thus improving the through-put of the sputtering device.

Figure 6:
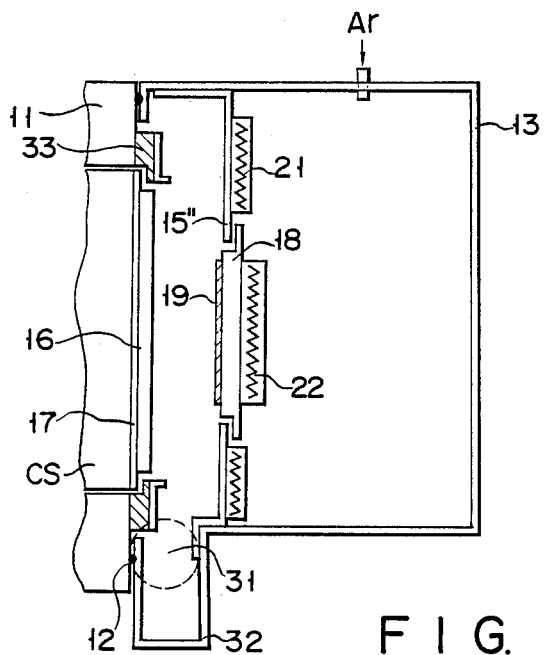
FIG. 6 is a cross-sectional view showing the internal structure of a high speed sputtering device according to a third embodiment of this invention.

FIG. 6 shows another embodiment of this invention. Unlike the dome-shaped protection plate in the former embodiment, protection plate 15″ in this embodiment is formed as a part of a partition wall and heater 21 is mounted on protection plate 15″. In this case, target power dispersing opening 31 and groove 32 are provided in the lower portion of vacuum chamber VC. Opening 31 is connected to a vacuum pump (not shown). With this construction, the same effect as in the former embodiment can be attained. In FIG. 6, 33 denotes a target earth shield.

Figure 5:
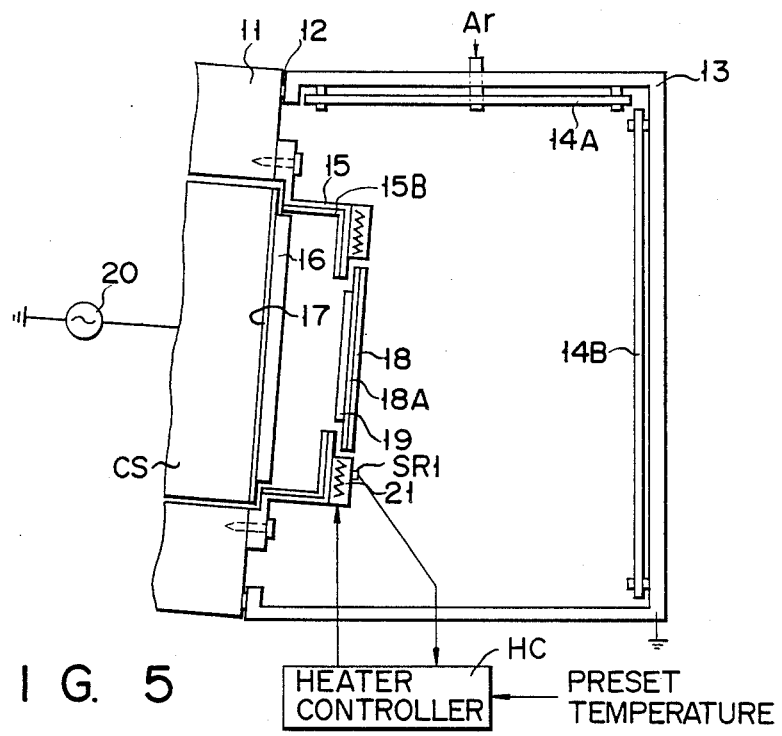
FIG. 5 is a cross-sectional view showing the internal structure of a high speed sputtering device according to a second embodiment of this invention.

This invention is not limited to the above described embodiments, and can be variously modified. For example, in the above embodiment, high purity quartz (SiO$_2$) is used as the source target material. However, this invention is effective when metals such as Mo and W series alloys, whose internal stresses are large enough to cause easy peel-off, are used as the target material. In this case, A.C. power source 20 is replaced by a D.C. power source. Further, in the above embodiment, heater units 21 and 22 are mounted on protection plate 15 and substrate holder 18. However, the same effect can be attained even when only heater unit 21 is mounted on protection plate 15 as shown in FIG. 5.

As described above, according to this invention, a sputtering device can be provided in which the number of dust particles produced in the chamber in the sputtering process can be reduced; while the advantage of a high speed sputtering device with the wafer substrate and target facing each other can be maintained.

What is claimed is:

1. A sputtering device comprising:
   a vacuum chamber;
   a target disposed in the vacuum chamber;
   a protection member formed to surround said target with a space therebetween and having an opening formed in front of said target;
   a substrate holder for holding the semiconductor wafer substrate and substantially closing the opening of said protection member in cooperation with the semiconductor wafer substrate;
   discharging means for causing target material to be emitted from said target when the semiconductor wafer substrate is disposed in front of said target, thereby depositing the target material on said semiconductor wafer substrate as a sputtered film; and
   heating means for heating at least said protection member to a specified temperature and maintaining the specified temperature after completion of sputtering.

2. A sputtering device according to claim 1, wherein said specified temperature is not more than 20° C. below the maximum temperature of said protection member to be attained while said sputtered film is formed.

3. A sputtering device according to claim 2, wherein said specified temperature is not lower than said maximum temperature.

4. A sputtering device according to claim 3, wherein said heating means includes a heater unit for heating said protection member, a temperature sensor for generating a signal indicating the temperature of said protection member, and heat control means coupled between said sensor and said heat control unit for controlling the heating operation of said heater unit in accordance with the signal of said temperature sensor to maintain said specified temperature.

5. A sputtering device according to claim 3, wherein said heating means includes first and second heater units for heating said protection member and substrate holder, respectively; first and second temperature sensors for generating first and second signals indicating the temperature of said protection member and the temperature of said substrate holder, respectively; and heat control means coupled between said first and second sensors and said first and second heat control means, respectively, for controlling said first and second heater units in accordance with said signals of the respective first and second temperature sensors to maintain said specified temperature.

6. A sputtering device according to claim 1, wherein said heating means includes a heater unit for heating said protection member.

7. A sputtering device according to claim 4, wherein said heating means further includes a heater unit for heating said substrate holder.

8. A sputtering device according to claim 1, wherein said target is formed of insulating material.

9. A sputtering device according to claim 1, wherein said target is formed of metal or metal alloy material.

* * * * *